Dec. 9, 1958 H. H. ZABEL ET AL 2,863,974

HEAT DISSIPATING ELECTRICAL CIRCUIT COMPONENT

Filed Feb. 7, 1955 2 Sheets-Sheet 1

INVENTORS
Harold H. Zabel
Daniel S. W. Kelly

BY Arthur H. Seidel

ATTORNEY

HEAT DISSIPATING ELECTRICAL CIRCUIT COMPONENT

Filed Feb. 7, 1955 2 Sheets-Sheet 2

INVENTORS
Harold H. Zabel
Daniel J. W. Kelly
BY
Arthur H. Seidel
ATTORNEY 2,863,974
Patented Dec. 9, 1958

1

2,863,974

HEAT DISSIPATING ELECTRICAL CIRCUIT COMPONENT

Harold H. Zabel, Milwaukee, and Daniel S. W. Kelly, Whitefish Bay, Wis., assignors to Allen-Bradley Company, Milwaukee, Wis., a corporation of Wisconsin Application February 7, 1955, Serial No. 486,313

2 Claims. (Cl. 201—63)

This invention relates to electrical circuit components and it more specifically resides in a heat extracting support of high thermal conductivity formed with a substantial surface area that closely conforms with and is in intimate contact with an electrical component supported thereby and that includes a substantial attachment area for effecting a high rate of heat transfer from the electrical component to a heat conductive base to which the support may be attached.

With increasing utilization of complex circuit networks employing circuit components in conjunction with electron tubes, transistors and the like it has become desirable to provide for precise mechanical positioning of each component and at times to combine certain circuit groupings in lumped preassembled sections. So-called printed circuits have been devised for this purpose but by reason of the method of insulation employed therein the energy dissipating ratings of the resistor components included in the circuits have been restricted.

In the practice of the present invention individual circuit components may be held by a common support member and connections may then be made between the terminal ends of the components, to complete a lumped circuit network portion that then constitutes a preassembly for insertion in a complex circuit of which it is a part. A particular feature of the invention is the successful accomplishment of the aim of securing enhanced energy dissipating ratings for components such as resistors without substantial increase in the physical dimensions of such components.

Fixed composition resistors are commonly available in ratings ranging upwardly to approximately two watts. A substantial portion of the heat generated within a composition resistor is conducted away through the terminal leads, and since the leads as presently provided in larger units are as large in diameter as may be tolerated, increased ratings are difficult to provide without a very substantial increase in the bulk of the resistor body or a prohibitive operating temperature. An increase in size that effectively increases the heat dissipation characteristics of the body consumes an undue amount of space, which is often at a premium in circuit assemblies. Further, weight and inertia values increase with size and make the component more vulnerable to damage by shock and vibration.

In the present invention there is included as a part of a resistor component a support of heat conductive material that closely conforms with and bears tightly against a portion of the surface area of the composition body of the resistor or an insulating sleeve surrounding the body to effect a rapid conduction of heat to such support. By mounting the support upon a heat conductive base or panel the heat is conducted thereto to thereby effectively increase the energy dissipating capacity of the component.

The composition resistor has exhibited very desirable characteristics, such as a long trouble free life, and ruggedness under certain conditions of abuse and economy.

2

Such a component is formed of organic materials and consequently is subject to deterioration if the internal temperatures rise to levels where charring might occur. Even though the heat evolved is led from the ends of a resistor component through the leads, the internal temperatures are at a maximum at the central interior. The temperature gradient between the end surfaces and the central interior is quite large. If this gradient may be reduced the wattage rating of a composition resistor may be materially enhanced. An increased wattage will permit the use of the reliable composition resistor where bulky wire wound units have previously been employed. To achieve this end it is an object of this invention to dissipate evolved heat in a composition resistor to lower the internal temperatures at the central portions with respect to the end temperatures, and to increase the rating of composition resistor components to permit the use thereof in applications not heretofore permissible.

It is another object of this invention to provide an electrical circuit component having clamping means of high thermal conductivity that will serve to mount the heat evolving portions of the component for rapid extraction of heat by the base to which it is secured.

It is another object of this invention to group circuit components into a unitary circuit network assembly that will aid inspection and servicing of a more complex network of which the components are a part.

It is another object of this invention to provide a mounting for electrical circuit components wherein the components may be grouped and connected by simplified means.

It is another object of this invention to provide electrical circuit component subassemblies which may be fabricated quickly and efficiently by quantity production methods to facilitate the assembly of complex circuit networks.

It is another object of this invention to provide a heat extracting structure for electric circuit components whereby components secured in such structure may employ smaller diameter lead wires, without detrimental effect upon the heat dissipating characteristics thereof.

Another object of this invention is to provide a heat dissipating jacket for a resistor component that exposes a portion of the composition body to reveal color coding or marking thereon.

It is another object of this invention to provide a mounting for electrical circuit components that protects the components from mechanical damage due to shock and vibration.

It is another object of this invention to provide a mounting for electrical circuit components that fixes and locates such components to minimize the possibility of developing either shorted or open circuits.

It is another object of this invention to provide a circuit component having a resistance section alongside of which is a plate presenting a capacitance between the circuit of the resistance section and the plate.

The foregoing and other objects and advantages of this invention will appear in the description to follow. In the description reference is made to the accompanying drawings, which form a part hereof, and in which there are shown by way of illustration and not of limitation specific forms in which the invention may be embodied.

In the drawings:

Fig. 1 is a front view in elevation of an improved electrical circuit component of this invention, Fig. 2 is in end view in elevation of the component shown in Fig. 1 shown attached to a fragment of a chassis, panel or frame upon which the component is mounted, Fig. 3 is a view in section of the component taken on the plane 3—3 indicated in Fig. 2, Fig. 4 is an enlarged fragmentary view in section of the component taken on the plane 3—3, Fig. 5 is a plan view of a grouping of electrical circuit components in which the invention may be embodied.

Figure 1:
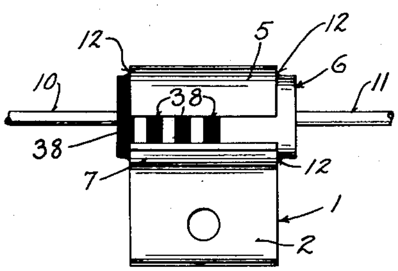
Figure 2:
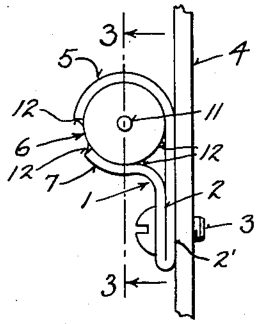
Figure 3:
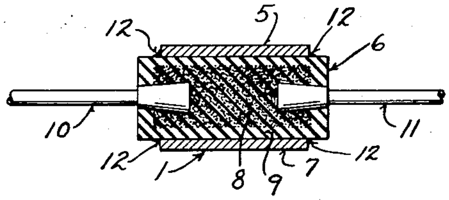

In Figs. 1–4 there is shown a form of the invention of general utility. A bracket 1 is formed from material of high thermal conductivity such as metal, particularly copper and aluminum, folded upon itself to present an attachment portion 2 with an opening adapted to receive a mounting screw 3 for attachment to an object having heat conductive characteristics such as a metallic base, frame or chassis 4. The attachment portion 2 presents a very substantial flat face 2' at the back of the bracket 1 that engages in intimate contact with the metallic base, frame or chassis 4 upon attachment by the means of the mounting screw 3. One end of the bracket 1 is curved to form a clamp segment 5 having a curvature, such that the inner surface thereof conforms closely with the outer surface of a fixed composition resistor 6 that is held by the bracket 1. The opposite end of the bracket 1 is pressed against the surface of the resistor 6 and forms a second clamp segment 7 with a surface also conforming with a substantial area of the cylindrical surface of the resistor 6. The resistor 6 is constructed with a central portion 8 comprising conductive carbon particles dispersed in a thermal setting material such as a phenol aldehyde resin, with an outer insulating jacket 9 of material that may also be of thermal setting resin like that in which the carbon particles are dispersed. Terminal leads 10, 11 are inserted at each end in intimate contact with the conductive central portion 8. About the cylindrical surface of the resistor 6 there appears a group of colored bands 38 indicative of the resistance value. The first two bands 38 represent digits, the third represents the exponent and the fourth band 38 gives a tolerance range within which the value may fall.

Upon passing a current through the resistor 6 heat is envolved within the portion 8 and the temperature rises. This energy dissipation in the form of heat limits the current capacity of the resistor, for temperatures may not be permitted to rise to a point where charring of the organic resin sets in. If the heat may be dissipated to keep the temperatures down, the rating of the resistor will be accordingly increased.

Figure 4:
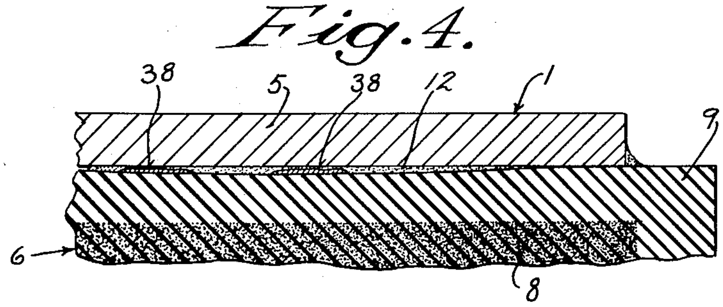
Figure 5:
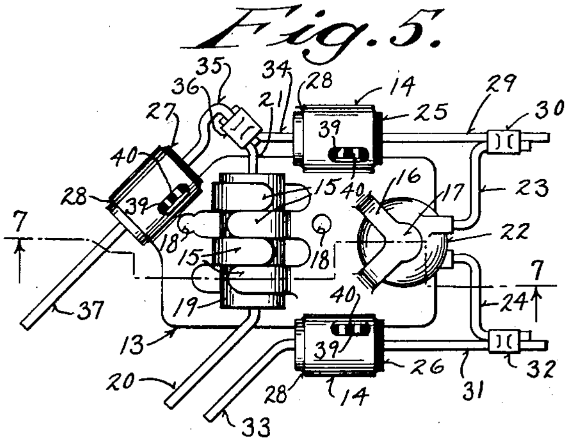
Figure 6:
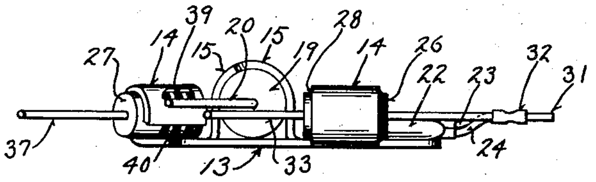
Fig. 6 is a side view in elevation of the grouping shown in Fig. 5.
Figure 7:
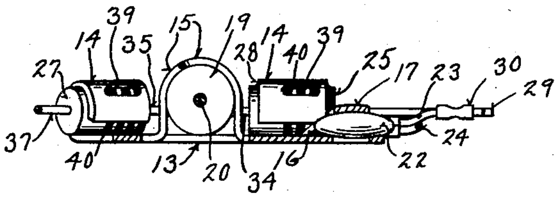
Fig. 7 is a view in elevation and in section of the grouping viewed through the plane 7—7 shown in Fig. 5.
Figure 8:
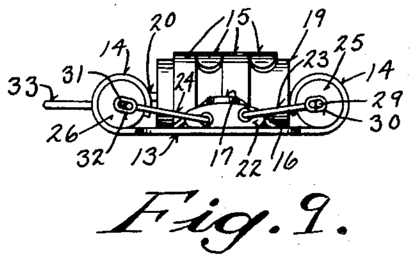
Fig. 8 is an end view in elevation of the grouping shown in Fig. 5.

To enhance the heat conductivity of the engagement between the resistor 6 and the bracket 1 a heat conductive material 12 is applied throughout the interface between the resistor 6 and the bracket 1 by coating either or both the resistor 6 and the inner conforming surface areas of the bracket 1 before assembly. The material 12 should have the property of wetting the interface areas to evenly flow and cover the surfaces before assembly. Intimate contact between the clamp segments 5 and 7 and the resistor 6 will be primarily a point to point contact as indicated in Fig. 4. Thus a film of the material 12 will occupy voids that occur between the closely conforming surfaces that have been brought into intimate bearing contact by a clamping engagement of the clamp segments 5 and 7, about the resistor 6. The material 12 may also be applied along edges of the bracket 1 to form fillets, as shown. Upon hardening the material 12 provides the superior heat conductivity of a solid substance in bonded relation to the transmitting and accepting bodies. To increase the heat conductivity of the material 12 minute particles of higher thermal conductivity may be dispersed in the material while fluid, and before application.

The closely conforming contacting relation between the outer cylindrical surface of the resistor 6 and the inner faces of the clamp segments 5 and 7 must be maintained throughout the temperature range of operation. To effectively maintain the contacting relation it is advantageous to select materials for the resistor 6 and the bracket 1 that have matched coefficients of expansion. Also, in some applications it may be of aid to serrate the inner faces of the clamp segments 5, 7 to multiply the points of physical contact.

The apparatus in Figs. 1, 2, 3 and 4 presents a composition resistor 6 that may readily be attached to a base, chassis, or other frame 4, for both a firm anchorage and for the formation of a heat conductive path leading from the resistor unit into a body having large emitting surface areas. The anchorage physically protects the resistor 6 and the hazard of mechanical breakdown is consequently lessened. Heat due to the energy dissipation within the composition component 6 will be conducted through the bracket 1 to the chassis 4. The very substantial facing surfaces between the resistor 6 and bracket 1 and between the bracket 1 and the base 4 affords a rapid dissipation channel for evolved heat. Also, the cross section of the bracket 1 is sufficient to rapidly conduct the heat. A marked increase in the wattage capacity of the resistor 6 results. For example, the wattage at which composition resistors may be operated through the adoption of the invention will readily exceed double that of prior ratings. Such increases cannot be satisfactorily achieved by increasing terminal lead size, or the bulk of the composition resistor body, because leads of increased stiffness are undesirable and the change in body dimension necessary for an appreciable increase in rating is excessive.

The ends of the clamp segments 5 and 7 are spaced to provide an axial gap rendering visible a portion of the cylindrical surface of the resistor 6. A portion of each of the color code bands 38 may be observed in the gap between the segments 5, 7 for ready identification of the component. Thus, a desired component may be readily selected from a supply and inserted into a circuit network being assembled or repaired.

The clamp segments 5, 7 being spaced about the resistance portion 8 of the resistor 6 introduce a capacitance between the resistance portion 8 and the segments 5, 7. The value of the capacitance may be varied to meet a demand for its introduction into the circuit of which the resistor 6 is to be a part. Thus, the complete component may have multiple electrical characteristics imparted thereto of benefit for particular applications.

Figure 9:
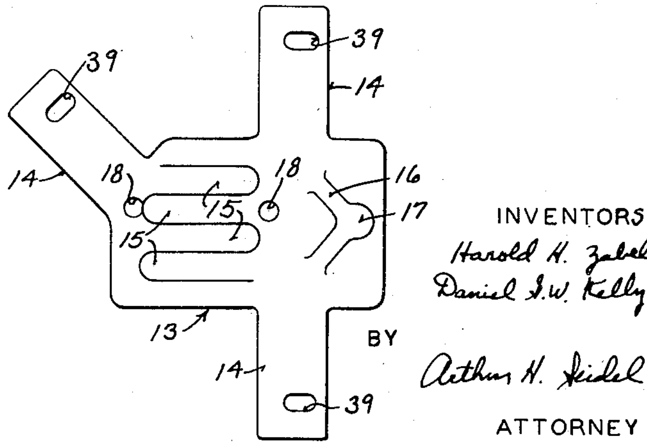
Fig. 9 is a plan view of a flat blank from which the mounting shown in Figs. 5-8 is formed.

In Figs. 5–9 the apparatus of this invention is shown in a form employing a bracket 13 which provides both a support and heat extracting member for a plurality of electrical circuit components. Bracket 13, like the bracket 1, is preferably formed of a metallic material having high thermal conductivity, such as copper, aluminum or steel, which have been found to be satisfactory for the purpose as they exhibit requisite thermal conductivity as well as strength and the ability to retain a formed configuration. As shown in Fig. 9 the bracket 13 is first cut as a flat blank, from which it is subsequently shaped. Three wing clips 14 with window apertures 39 are each formed by rolling a corresponding flat extension upwardly and inwardly into a cylindrical-like configuration. A set of four fingers 15, formed by piercing the bracket 13, are each bent upwardly and curved, as shown, in Figs. 5–8. A forked clip 16 with a pendant end 17 is also cut in the bracket 13 and raised above the general level of the remaining bracket. To complete the bracket 13 a pair of mounting holes 18 are cut to receive rivets, mounting screws or the like, for attachment of the bracket 13 to a base, chassis or mounting panel.

A tubular capacitor 19 is inserted and firmly held between the raised fingers 15. A lead 20 extends from one end of the capacitor 19 that will connect with the circuit of the network of which the lumped assembly shown in Figs. 5–8 will form a part. A second lead 21 that is connected in a manner to be hereinafter described extends from the opposite end of the capacitor 19. A second capacitor 22 of thin wafer-like configuration with terminal leads 23 and 24 is held in place by the clip 16.

Three fixed composition resistors 25, 26 and 27 with color code markings 40 are each held within one of the wing clips 14. Substantially the entire cylindrical surface of each resistor 25, 26, 27 is encircled by the associated wing clip 14, with an intimate contact between each clip 14 and the associated resistor 25, 26, 27 similarly as that described in conjunction with the bracket 1 and resistor 6.

To obtain such intimate contact, the resistors 25, 26 and 27 are each inserted within the clips 14 with a tight fit and a heat conductive material 28 is applied throughout the interface between the resistors 25, 26 and 27 and the bracket clips 14. The cementitious material 28 applied both in the form of the invention of Figs. 5–9, and in the form of Figs. 1–4 may, for example, comprise an adhesive of the ethoxyline, silicone or alkyd glyptal type, that will occupy voids and openings appearing between the resistors and the brackets, as well as forming fillets along the interface edges.

The resistor 25 is provided with a terminal lead 29 electrically connected to the lead 23 of the capacitor 22 by a compression band 30. Similarly a lead 31 of the resistor 26 is connected by a compression band 32 to the lead 24 of the capacitor 22. In fastening the bands 30 and 32 the leads to be joined are inserted within the respective band and by means of a suitable tool the band is squeezed and crimped to provide both an electrical contact and a sturdy physical connection. A terminal lead 34 extends from the resistor 25 and is connected to both the lead 21 of the capacitor 19 and a lead 35 at one end of the resistor 27 by means of another compression band 36. A lead 37 extends from the opposite end of the resistor 27 that will be connected in a circuit of which the form of the invention in Figs. 5–8 is a part.

The completed lumped circuit component shown in Figs. 5–8 comprises a preassembled circuit subassembly adapted for inclusion within a complete circuit network. The terminals within the lumped component are easily and conveniently connected one to another, and where substantial numbers of like circuit networks are to be constructed lumped subassemblies may be formed for facilitating final assembly. By attachment of the bracket 13 to a base or chassis physical protection is afforded the resistors and capacitors. The rigid attachment reduces shock and vibration and enhances the ruggedness of the circuit elements.

The circuit network portion presented by the form of the invention in Figs. 5–8 is illustrative of circuitry interconnecting a pair of tubes in an amplifier circuit. As such, the lead 29 of the resistor 25 is adapted for connection to the plate of an output tube in the first stage of amplification, and the lead 37 of resistor 27 is adapted for connection to the plus terminal of a plate voltage supply. The lead 31 of the resistor 26 is adapted for connection to the grid of a tube in the second stage of amplification, and the lead 33 is provided for connection to a grid voltage supply. The capacitor 22 constitutes a direct current block that passes an alternating signal between stages, and the capacitor 19 has one lead 20 for connection to the voltage supply, in accordance with amplifier design. Thus the interconnections between the input and output tubes of a two stage amplifier are compactly arranged and lumped together for convenient handling and assembly. The functions of the various circuit components may be readily observed and understood by one called upon to test or maintain the circuit network, since visual observation of the circuitry more readily identifies the individual components.

We claim:

1. In an electrical circuit component the combination of a composition resistor unit having a cylindrical outer surface and stripes of color thereon indicative of resistance value; and a heat conductive metallic bracket formed of a strip bent upon itself to provide an attachment portion and having one end curved to present a first clamp element with a surface that closely conforms with a portion of the cylindrical surface of said resistor and the opposite end curved to present a second clamp element with a surface that closely conforms with a portion of the cylindrical surface of said resistor opposite that to which the first element conforms, said elements clampingly engaging said resistor with the ends of the strip being spaced to retain visibility of said stripes of color.

2. An electrical circuit component in accordance with claim 1 having a solidified filler material applied to the interface of the resistor unit and bracket which is in adherent contact with both the resistor unit and bracket.

References Cited in the file of this patent

UNITED STATES PATENTS

| | | |
|---|---|---|
| 2,086,727 | Morris | July 13, 1937 |
| 2,409,772 | Lund | Oct. 22, 1946 |
| 2,417,261 | Morehouse | Mar. 11, 1947 |
| 2,558,798 | Thom | July 3, 1951 |